(12) United States Patent
Lutz

(10) Patent No.: US 7,041,225 B2
(45) Date of Patent: *May 9, 2006

(54) MICROMECHANICAL COMPONENT AND METHOD FOR PRODUCING THE SAME

(75) Inventor: Markus Lutz, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 337 days.

This patent is subject to a terminal disclaimer.

(21) Appl. No.: 10/240,339

(22) PCT Filed: Mar. 10, 2001

(86) PCT No.: PCT/DE01/00921

§ 371 (c)(1), (2), (4) Date: May 9, 2003

(87) PCT Pub. No.: WO01/77009

PCT Pub. Date: Oct. 18, 2001

(65) Prior Publication Data

US 2003/0173330 A1 Sep. 18, 2003

(30) Foreign Application Priority Data

Apr. 7, 2000 (DE) ................ 100 17 422

(51) Int. Cl.
*C23F 1/00* (2006.01)

(52) U.S. Cl. ........................................ 216/2

(58) Field of Classification Search ............ 216/2, 216/11, 17, 20, 24, 33, 36; 438/22, 24, 48, 438/50, 52, 53, 689, 694, 696, 700, 702; 73/514.15–514.39; 257/414–419

See application file for complete search history.

(56) References Cited

U.S. PATENT DOCUMENTS

| 4,665,610 A | 5/1987 | Barth |
| 5,760,455 A * | 6/1998 | Hierold et al. .............. 257/415 |

FOREIGN PATENT DOCUMENTS

| DE | 195 09 868 | 9/1996 |
| DE | 195 37 814 | 4/1997 |
| EP | 0 001 038 | 3/1979 |

OTHER PUBLICATIONS

C Liu et al.: "Sealing a Micromachined Cavities Using Chemical Vapor Deposition Methods: Characterization and Optimization" Journal of Microelectromechanical Systems, IEEE Inc. New York, US, vol. 8, No. 2, pp. 135-145*.

(Continued)

*Primary Examiner*—Parviz Hassanzadeh
*Assistant Examiner*—Roberts Culbert
(74) *Attorney, Agent, or Firm*—Kenyon & Kenyon, LLP

(57) ABSTRACT

A method of manufacturing a micromechanical component having the following steps is described: providing a substrate (1); providing a first micromechanical functional layer (5) on the sacrificial layer (4); structuring the first micromechanical functional layer (5) in such a manner that it is provided with a mobilizable sensor structure (6); providing and structuring a first sealing layer (8) on the structured first micromechanical functional layer (5); providing and structuring a second micromechanical functional layer (10) on the first sealing layer (8) which has at least a covering function and is at least partially anchored in the first micromechanical functional layer (5); making the sensor structure (6) movable and providing a second sealing layer (8) on the second micromechanical functional layer (10). A corresponding micromechanical component is also described.

27 Claims, 2 Drawing Sheets

OTHER PUBLICATIONS

Y B Ning et al.: "Fabrication of a silicon micromachined capacitive microphone using a dry-etch process" Sensors And Actuators A, CH, Elsevier Sequoia S.A., Lausanne, vol. 53, No. 1, pp. 237-242*.

A Partridge et al.: "New thin film epitaxial polysilicon encapsulation for piezoresistive accelerometers" Technical Digest. MEMS 2001. 14th IEEE International Conference on Micro Electro Mechanical Systems (CAT. No. 01CH37090), Technical Digest MEMS 2001. 14th IEEE International Conference on MEMS. Interlaken. Ch. 21-25, pp. 54-59*.

* cited by examiner

MICROMECHANICAL COMPONENT AND METHOD FOR PRODUCING THE SAME

BACKGROUND INFORMATION

The present invention relates to a micromechanical component having a substrate an a movable sensor structure in a first micromechanical functional layer on the sacrificial layer. The present invention also relates to a corresponding manufacturing method.

Although it is applicable to any micromechanical components and structures, in particular to sensors and actuators, the present invention and the underlying problem are elucidated with reference to a micromechanical component, e.g., an acceleration sensor, that is manufacturable using silicon surface micromechanical technology.

Monolithically integrated inertial sensors manufactured by surface micromechanical technology in which the sensitive movable structures are situated on the chip without protection (analog devices) are generally known. This results in increased expenses for handling and packaging.

This problem may be circumvented by a sensor, the structures manufactured by surface micromechanics being covered by a second cap wafer. This type of packaging is responsible for a large share (approximately 75%) of the cost of manufacturing an acceleration sensor by surface micromechanical. These costs arise as a result of the high surface area requirements of the sealing surface between the cap wafer and the sensor wafer and due to the complex structuring (2–3 masks, bulk micromechanics) of the cap wafer.

The structure of a functional layer system and a method for hermetic capping of sensors using surface micromechanics is described in German Patent Application 195 37 814 A1. The manufacture of the sensor structure using known technological methods is explained. The cited hermetic capping is performed using a separate cap wafer made of silicon, which is structured using expensive structuring processes such as KOH etching. The cap wafer is applied to the substrate with the sensor (sensor wafer) using a seal glass. This requires a wide bonding frame around each sensor chip to ensure an adequate adhesion and sealing ability of the cap. This limits the number of sensor chips per sensor wafer considerably. Due to the large amount of space required and the expensive manufacture of the cap wafer, sensor capping incurs considerable costs.

ADVANTAGES OF THE INVENTION

The manufacturing method of the present invention having the features of claim 1 and the micromechanical component as recited in claim 12 have the following advantages.

It builds on a known surface micromechanical method which creates epitaxial polysilicon of a thickness of at least 10 µm to form a micromechanical functional layer. No novel permeable layer is required but rather known processes are used. The only novel feature is the step to produce the sealing layers which have a sealing and leveling function.

The result is that the surface micromechanical method is simplified since the cap wafer is not needed due to the second micromechanical functional layer which performs at least one cover function and the structures may be contacted from above.

In addition, the functionality of the process is enhanced, i.e., additional mechanical and/or electrical components to implement the component are available to the designer. The following functional elements in particular may be created:

- a pressure sensor diaphragm in the second micromechanical functional layer;
- a printed conductor structure in the second micromechanical functional layer which is capable of crossover with an additional printed conductor structure provided above the second sealing layer;
- very low-resistance aluminum leads in the additional printed conductor structure provided above the second sealing layer;
- a vertical differential capacitor;
- additional anchor points of the structures of the first micromechanical functional layer in the second micromechanical functional layer.

Customary IC packaging methods such as hybrid, plastic, flip-chip, etc. may also be used.

The dependent claims contain advantageous refinements of and improvements on the object of the present invention.

According to a preferred refinement, a sacrificial layer is provided on the substrate and the sacrificial layer is etched to mobilize the sensor structure. In a simplified version, the substrate may be provided with a sacrificial layer and the first micromechanical functional layer may be provided as a silicon-on-insulator (SOI) structure.

According to another preferred refinement, the first micromechanical functional layer is structured in such a way that it has passages extending to the sacrificial layer. Furthermore, the second micromechanical functional layer is structured in such a way that it has second passages extending to the first sealing layer, the second passages being connected to the first sealing layer by connection areas. The first sealing layer is then etched to remove the connection areas using the second passages as etch channels. Finally, the sacrificial layer is etched using the first and second passages connected together by the removal of the connection areas. This minimizes the cost of the etching processes since it is possible to etch the sacrificial layer and the first sealing layer in one step.

Thus, etch channels running through the first and second micromechanical functional layer and the intermediate first sealing layer are produced to remove the optionally provided sacrificial layer. This makes it possible to increase the thickness of the second micromechanical functional layer and improve its strength or stiffness. As a consequence, it is possible to span large areas and expose the components to greater stress. When removing the sacrificial layer, it not necessary to be concerned with the aluminum of the printed conductors or the like since it is not applied until a later point in time.

According to another preferred refinement, a buried polysilicon layer is provided below the first or second micromechanical functional layer. It is also possible to dispense with the buried polysilicon and an insulation layer lying below it since additional wiring levels above the sensor structure are available.

According to another preferred refinement, the first and second sealing layer are designed substantially thinner than the first and second micromechanical functional layer.

According to another preferred refinement, the first and/or second sealing layers are provided by a nonconforming deposition in such a manner that only the upper areas of the first and second passages, respectively, are obstructed. This reduces the etching time for removal of the sacrificial layer since only a portion of the passages is obstructed.

According to another preferred refinement, the first and/or second passages are designed as trenches or holes which narrow toward the top.

According to another preferred refinement, the first and/or second micromechanical functional layers are made of a conductive material, preferably polysilicon.

According to another preferred refinement, the first and/or second sealing layers are made of a dielectric material, preferably silica.

According to another preferred refinement, one or more printed conductor layers, preferably made of aluminum, are provided on the second sealing layer.

According to another preferred refinement, a printed conductor structure is integrated into the second micromechanical functional layer.

DRAWING

Exemplary embodiments of the present invention are illustrated in the drawing and described in detail in the description below.

DETAILED DESCRIPTION OF THE EXEMPLARY EMBODIMENTS

In the figures, identical reference symbols denote identical or functionally equivalent components.

Figure 1:
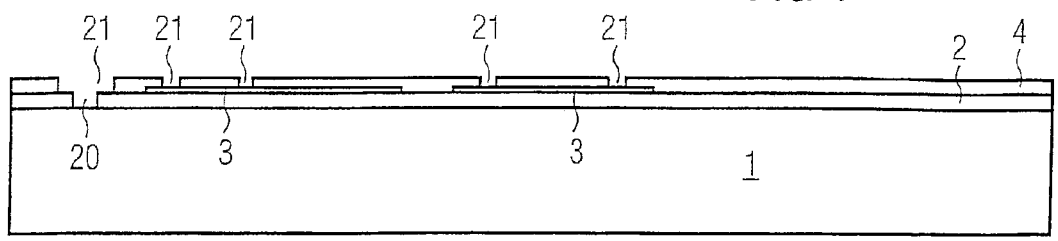
FIG. 1 shows a schematic cross-sectional view of a micromechanical component according to a first embodiment of the present invention in a first process stage.

FIG. 1 shows a schematic cross-sectional view of a micromechanical component according to a first embodiment of the present invention in a first process stage.

In FIG. 1, 1 denotes a silicon substrate wafer, 2 a lower oxide, 3 a buried polysilicon layer, 4 a sacrificial oxide, 20 a contact hole in lower oxide 2 and 21 denotes contact holes in sacrificial oxide 4.

In order to manufacture the structure shown in FIG. 1, lower oxide 2 is first deposited on the entire surface of silicon substrate wafer 1. In a subsequent step, polysilicon is deposited and structured to produce printed conductors in buried polysilicon layer 3.

Subsequently, sacrificial oxide 4 is applied to the entire surface of the overall structure using, for example, a low-temperature oxide (LTO) method or a tetraethyl orthosilicate (TEOS) method. Then contact holes 20 and 21 are created at the intended locations using conventional photomethods and etching methods.

Figure 2:
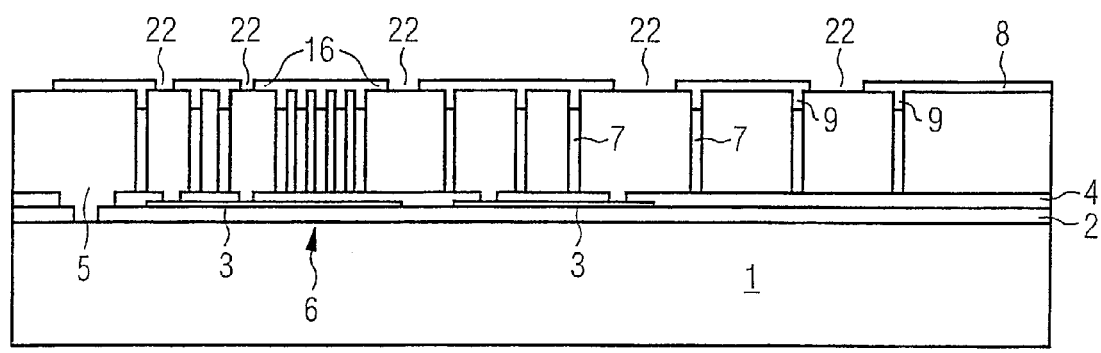
FIG. 2 shows a schematic cross-sectional view of the micromechanical component according to the first embodiment of the present invention in a second process stage.

FIG. 2 shows a schematic cross-sectional view of the micromechanical component according to the first embodiment of the present invention in a second process stage.

In addition to the reference symbols already introduced in FIG. 2, 5 denotes a first micromechanical functional layer in the form of an epitaxial polysilicon layer, 6 a sensor structure (comb structure) to be mobilized later, 7 trenches in first micromechanical functional layer 5, 8 a first sealing oxide (LTO, TEOS or the like), 9 plugs in trenches 7 made of sealing oxide 8, 16 oxide connection areas for the later sacrificial oxide etching and 22 contact holes in sealing oxide 8.

To manufacture the structure shown in FIG. 2, epitaxial polysilicon is first deposited in a known manner to form first micromechanical functional layer 5 and micromechanical functional layer 5 is structured to form sensor structure 6 to be mobilized and trenches 7.

This is followed by a refill process to seal trenches 7 using sealing oxide 8 and subsequent optional planarization. Although it is not mentioned explicitly below, such planarization may in principle be performed after each layer deposition on the entire surface.

Figure 5:
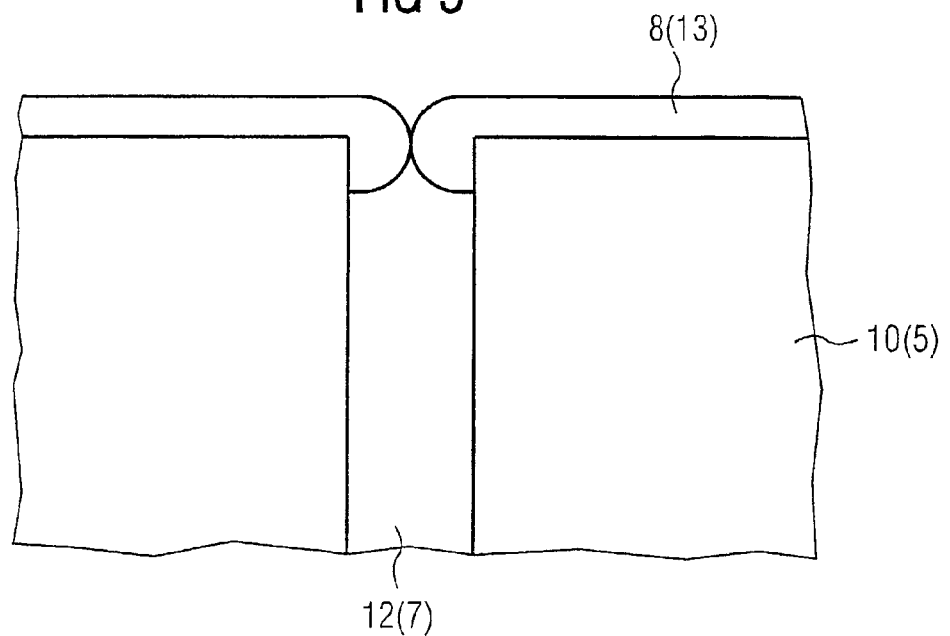

In the example shown, the refill is not complete but rather covers 100% of the underlying structure upward only and also provides a seal. This is shown in greater detail in FIG. 5.

A process follows to form contact holes 22 by conventional photomethods and etching methods. These contact holes 22 are used to anchor second micromechanical functional layer 10 to be applied later (see FIG. 3) and to limit oxide connection areas 16 for later sacrificial oxide etching.

Figure 3:
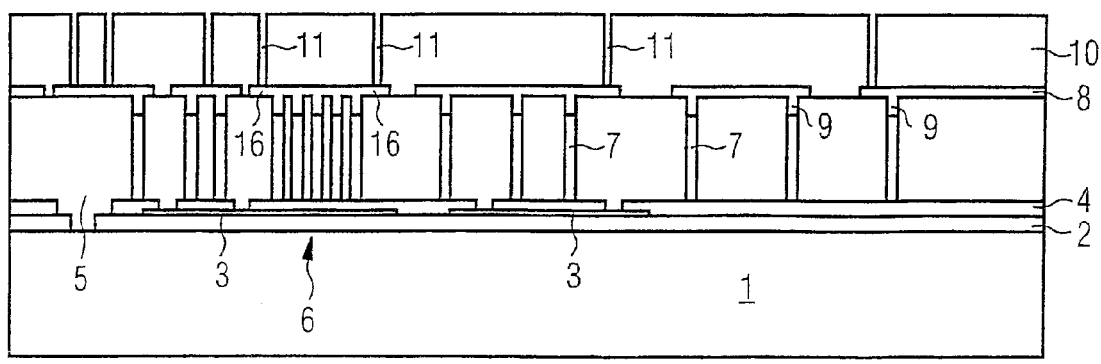
FIG. 3 shows a schematic cross-sectional view of the micromechanical component according to the first embodiment of the present invention in a third process stage.

FIG. 3 shows a schematic cross-sectional view of the micromechanical component according to the first embodiment of the present invention in a third process stage.

In addition to the reference symbols already introduced in FIG. 3, 10 denotes a second micromechanical functional layer in the form of an epitaxial polysilicon layer and 11 denotes trenches in second micromechanical functional layer 10.

To form the structure shown in FIG. 3, second micromechanical functional layer 10 is deposited in a manner similar to first micromechanical functional layer 5 as a stable sealing layer for underlying sensor structure 6. In addition to this sealing function, second micromechanical functional layer 10 may of course also be used for contacting, as a feed, as an upper electrode, etc. for the component. This layer 10 is then structured to produce trenches 11 which are later required together with trenches 9 for the sacrificial oxide etching.

Figure 4:
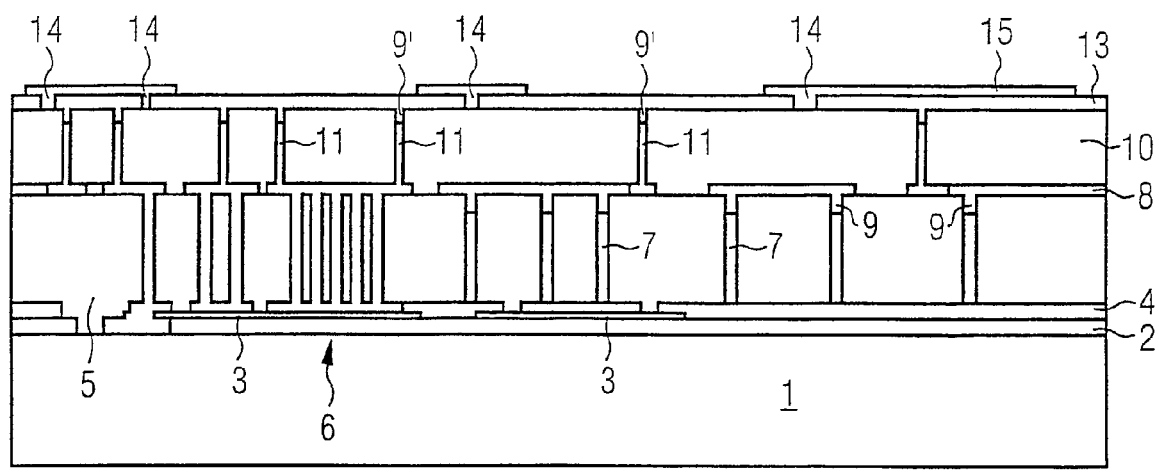
FIG. 4 shows a schematic cross-sectional view of the micromechanical component according to the first embodiment of the present invention in a fourth process stage and FIG. 5 shows an enlarged detail of the schematic cross-sectional view of the micromechanical component according to the first embodiment of the present invention as shown in FIG. 4.

FIG. 4 shows a schematic cross-sectional view of the micromechanical component according to the first embodiment of the present invention in a fourth process stage.

In addition to the reference symbols already introduced in FIG. 4, 13 denotes a second sealing oxide (LTO, TEOS or the like), 14 a contact hole in sealing oxide 13, 15 a printed conductor level made of aluminum which is connected to second micromechanical functional layer 10 via contact holes 14.

Starting from the process stage shown in FIG. 3, the following steps are carried out to achieve the process stage according to FIG. 4. First, sealing oxide 8 is etched to remove oxide connection areas 16 using second trenches 11 as etch channels. Sacrificial layer 4 is then etched using first and second trenches 7, 11 connected together by removing connection areas 16 as etch channels. A long sacrificial oxide etching is possible since no aluminum is present on the surface at this time.

In a subsequent process step, a second refill process forms second sealing oxide 13, this deposition also not being a conforming deposition but rather only the surfaces of trenches 11 are occluded. This is illustrated in greater detail in FIG. 5. The internal pressure or internal atmosphere contained in sensor structure 6 is a function of the process conditions of the refill process. These parameters determine, e.g., the damping of the sensor structure.

Second sealing oxide 13 is then structured to form contact holes 14 and printed conductor level 15 made of aluminum is deposited and structured.

Although the present invention has been described above on the basis of a preferred exemplary embodiment, it is not limited to it but instead is modifiable in a variety of ways.

In particular, any micromechanical base materials such as, e.g., germanium may be used and not only the silicon substrate cited as an example.

Also, any sensor structures may be formed and not only the acceleration sensor illustrated.

Although not shown in the figures, trenches 7 and 11 may be designed to narrow toward the top in order to promote the non-conforming deposition of first and second sealing layers 8, 13.

The layer thicknesses of first and second micromechanical functional layer 5, 10 may be varied by the epitaxial and planarization process in a simple manner since the sacrificial layer etching is not a function of the permeability of the second micromechanical functional layer.

Of course, the micromechanical functional layer/sealing layer sequence may be repeated and it is also possible to provide a buried printed conductor under each micromechanical functional layer above the underlying micromechanical functional layer.

Finally, it is also possible to apply additional wiring levels made of aluminum or other suitable metals with dielectric lying between them.

It is also possible to planarize the individual levels using chemical-mechanical polishing, for example, in a single polishing step, preferably only for the second sealing level.

What is claimed is:

1. A method of manufacturing a micromechanical component, the method comprising:
   providing a substrate;
   providing a first micromechanical functional layer on a sacrificial layer;
   structuring the first micromechanical functional layer so that it has a mobilizable sensor structure;
   providing and structuring a first sealing layer on the structured first micromechanical functional layer;
   providing and structuring a second micromechanical functional layer on the first sealing layer, which has at least a covering function and which is at least partially anchored in the first micromechanical functional layer;
   arranging the sensor structure to be movable; and
   providing a second sealing layer on the second micromechanical functional layer;
   wherein the first and second sealing layers are thinner than the first and second micromechanical functional layers.

2. The method of claim 1, further comprising:
   providing a sacrificial layer on the substrate; and
   etching the sacrificial layer to make the sensor structure movable.

3. The method of claim 1, comprising:
   structuring the first micromechanical functional layer so that it has first passages extending to the sacrificial layer;
   structuring the second micromechanical functional layer so that it has second passages extending to the first sealing layer, the second passages being connected to the first passages by connection areas of the first sealing layer;
   etching the first sealing layer to remove the connection areas using the second passages as etch channels; and
   etching the sacrificial layer using the first and second passages, connected to each other by removing the connection areas, as etch channels.

4. The method of claim 1, further comprising:
   providing a buried polysilicon layer below the first and the second micromechanical functional layers.

5. The method of claim 3, wherein at least one of the first and the second sealing layers are provided by a non-conforming deposition so that only upper areas of the first and the second passages are occluded.

6. A method of manufacturing a micromechanical component, the method comprising:
   providing a substrate;
   providing a first micromechanical functional layer on a sacrificial layer;
   structuring the first micromechanical functional layer so that it has a mobilizable sensor structure;
   providing and structuring a first sealing layer on the structured first micromechanical functional layer;
   providing and structuring a second micromechanical functional layer on the first sealing layer, which has at least a covering function and which is at least partially anchored in the first micromechanical functional layer;
   arranging the sensor structure to be movable;
   providing a second sealing layer on the second micromechanical functional layer;
   wherein the first and second sealing layers are thinner than the first and second micromechanical functional layers; and
   configuring at least one of the first and the second passages as one of trenches and holes which narrow toward a top.

7. The method of claim 1, wherein at least one of the first and the second micromechanical functional layers are manufactured from a conductive material.

8. The method of claim 7, wherein the conductive material includes polysilicon.

9. The method of claim 1, wherein at least one of the first and the second sealing layers are manufactured from a dielectric material.

10. The method of claim 9, wherein the dielectric material includes silica.

11. The method of claim 1, further comprising:
    providing at least one printed conductor layer on the second sealing layer.

12. The method of claim 11, wherein the at least one printed conductor layer includes aluminum.

13. The method of claim 1, further comprising:
    integrating a printed conductor structure into the second micromechanical functional layer.

14. A micromechanical component, comprising:
    a substrate;
    a first micromechanical layer arranged above the substrate, and including a movable sensor structure;
    a first sealing layer on the first micromechanical functional layer, and which is at least partially structured;
    a second micromechanical functional layer on the first sealing layer, and which at least partially anchored in the first micromechanical functional layer for providing at least a covering function; and
    a second sealing layer on the second micromechanical functional layer;
    wherein the first and second sealing layers are thinner than the first and second micromechanical functional layers.

15. The micromechanical component of claim 14, further comprising:

a sacrificial layer located on the substrate, wherein the movable sensor structure is arranged above the sacrificial layer and is mobilizable by at least partially removing the sacrificial layer.

16. The micromechanical component of claim 15, wherein:
   the first micromechanical functional layer has first passages extending to a depth of the sacrificial layer;
   the second micromechanical functional layer has second passages extending to a depth of the first sealing layer; and
   the first and second passages are connected to each other by removed connection areas of the first sealing layer.

17. The micromechanical component of claim 14, further comprising:
   a buried polysilicon layer arranged below the movable sensor structure between the sacrificial layer and the substrate.

18. The micromechanical component of claim 16, wherein at least one of the first and the second sealing layers includes plugs for sealing corresponding first and second passages.

19. A micromechanical component, comprising:
   a substrate;
   a first micromechanical layer arranged above the substrate, and including a movable sensor structure;
   a first sealing layer on the first micromechanical functional layer, and which is at least partially structured;
   a second micromechanical functional layer on the first sealing layer, and which at least partially anchored in the first micromechanical functional layer for providing at least a covering function; and
   a second sealing layer on the second micromechanical functional layer;
   wherein the first and second sealing layers are thinner than the first and second
   micromechanical functional layers, and
   wherein at least one of the first and the second passages include one of trenches and holes which narrow toward a top.

20. The micromechanical component of claim 14, wherein at least one of the first and the second micromechanical functional layer is manufactured from a conductive material.

21. The micromechanical component of claim 14, wherein the conductive material includes polysilicon.

22. The micromechanical component of claim 14, wherein at least one of the first and the second sealing layers are manufactured from a dielectric material.

23. The micromechanical component of claim 14, wherein the dielectric material includes silica.

24. The micromechanical component of claim 14, further comprising:
   at least one printed conductor layer arranged on the second sealing layer.

25. The micromechanical component of claim 24, wherein the at least one printed conductor layer includes aluminum.

26. The micromechanical component of claim 14, wherein the second micromechanical functional layer includes a printed conductor structure.

27. The micromechanical component of claim 14, wherein the second micromechanical functional layer includes a diaphragm structure.

* * * * *

UNITED STATES PATENT AND TRADEMARK OFFICE
CERTIFICATE OF CORRECTION

| | |
|---|---|
| PATENT NO. | : 7,041,225 B2 |
| APPLICATION NO. | : 10/240339 |
| DATED | : May 9, 2006 |
| INVENTOR(S) | : Markus Lutz |

Page 1 of 4

It is certified that error appears in the above-identified patent and that said Letters Patent is hereby corrected as shown below:

In the Abstract (57), change "ABSTRACT" to --ABSTRACT OF THE DISCLOSURE--,
In the Abstract (57), delete "(1), (5), (4), (5), (6)"

Column 1, line 4, change "BACKGROUND INFORMATION" to --FIELD OF THE INVENTION--
Column 1, line 11, change "it is" to -- it may be--
Column 1, line 17, between the paragraphs insert the header --BACKGROUND INFORMATION--
Column 1, line 17, change "sensors manufactured" to --sensors may be manufactured--
Column 1, line 19, change "are situated on" to --are arranged on--
Column 1, line 20, delete "are generally known".
Column 1, line 21, change "This results in" to -- This may result in--
Column 1, line 24, change "packaging is responsible" to --packaging may be responsible--
Column 1, line 26, change "share (approximately" to -- share such as, for example approximately--
Column 1, line 27, change "micromechanical. These" to -- micromechanical technology--
Column 1, line 27, change "These costs arise" to --These costs may arise--
Column 1, line 33, change "in German Patent" to --in German Published Patent--
Column 1, line 33, change "Patent Application 195" to --Patent Application No. 195--
Column 1, line 34, delete "A1"
Column 1, line 34, change "structure using known" to --structure using technological--
Column 1, line 38, change "using expensive structuring" to --using structuring--
Column 1, line 39, change "KOH etching." to --as KOH etching, that may be expensive.--
Column 1, line 41, change "This requires a" to --This may require a--
Column 1, line 43, change "This limits the" to --This may limit the--
Column 1, line 45, change "the expensive manufacture" to --the expense of manufacture--
Column 1, line 46, change "capping incurs considerable" to --capping may incur considerable--
Column 1, line 47, change "ADVANTAGES OF THE INVENTION" to --SUMMARY OF THE INVENTION--

UNITED STATES PATENT AND TRADEMARK OFFICE
CERTIFICATE OF CORRECTION

| | |
|---|---|
| PATENT NO. | : 7,041,225 B2 |
| APPLICATION NO. | : 10/240339 |
| DATED | : May 9, 2006 |
| INVENTOR(S) | : Markus Lutz |

It is certified that error appears in the above-identified patent and that said Letters Patent is hereby corrected as shown below:

Column 1, line 50, change "present invention having the features of claim 1 and the micromechanical component as recited in claim 12 have the following advantages" to -- present invention may have the following features.--

Column 1, line 53, change "It builds on a known surface micromechanical" to -- It may build on a prior surface micromechanical --

Column 1, line 55, change "No novel permeable" to --A novel permeable--

Column 1, line 56, change "layer is required but rather known processes are used." to -- layer may not be required but rather other prior processes may be used--

Column 1, line 57, change "The only novel feature is the step" to -- A novel feature may include the step --

Column 1, line 64, change "of the process is enhanced," to -- of the process may be enhanced, --

Column 1, line 66, change "the component are" to -- the component may be --

Column 2, line 14, change "Customary IC" to --Other prior IC--

Column 2, line 16, delete "The dependent claims contains advantageous refinements of and improvements on the object of the present invention."

Column 2, line 18, change "According to a preferred refinement" to --According to an exemplary refinement--

Column 2, line 18, change "layer is provided" to --layer may be provided--

Column 2, line 19, change "layer is etched" to --layer may be etched--

Column 2, line 24, change "another preferred refinement" to --another exemplary refinement--

Column 2, line 25, change "layer is structured in such a way that" to --layer may be structured so that--

Column 2, line 28, change "layer is structured in such a way that" to --layer may be structured so that--

Column 2, line 32, change "layer is then etched" to --layer may then be etched--

Column 2, line 34, change "layer is etched" to --layer may be etched--

Column 2, line 36, change "This minimizes the" to --This may minimize the --

Column 2, line 37, change "sealing layer in one" to --sealing layer may be etched in one--

Column 2, line 41, change "layer are produced" to --layer may be produced--

Column 2, line 42, change "This makes it possible to increase the" to --Therefore, the--

Column 2, line 43, change "functional layer and" to --functional layer may be increased and--

Column 2, line 44, change "and improve its strength or stiffness. As a consequence, it is possible to span large" to --and its strength or stiffness may be improved. As a consequence, large--

Column 2, line 44, Insert new paragraph starting with --As a consequence--

UNITED STATES PATENT AND TRADEMARK OFFICE
CERTIFICATE OF CORRECTION

| | |
|---|---|
| PATENT NO. | : 7,041,225 B2 |
| APPLICATION NO. | : 10/240339 |
| DATED | : May 9, 2006 |
| INVENTOR(S) | : Markus Lutz |

It is certified that error appears in the above-identified patent and that said Letters Patent is hereby corrected as shown below:

Column 2, line 46, change "layer, it not necessary to be concerned with the" to -- layer, the--

Column 2, line 48, change "conductors or the like since it is not applied" to -- conductors or the like may not be a concern since it may not be applied--

Column 2, line 50, change "another preferred refinement" to --another exemplary refinement--

Column 2, line 52, change "It is also possible to dispense with the buried" to --The buried--

Column 2, line 53, change "below it since" to --below it may be dispensed with since--

Column 2, line 54, change "structure are available" to --structure may be available--

Column 2, line 56, change "another preferred refinement" to --another exemplary refinement--

Column 2, line 57, change "layer are designed substantially" to --layer may be configured substantially--

Column 2, line 58, change "another preferred refinement" to --another exemplary refinement--

Column 2, line 60, change "layers are provided" to --layers may be provided--

Column 2, line 61, change "deposition in such a manner that" to --deposition so that--

Column 2, line 63, change "This reduces the" to --This may reduce the--

Column 2, line 64, change "passages is obstructed." to --passages may be obstructed.--

Column 2, line 65, change "another preferred refinement" to --another exemplary refinement--

Column 2, line 66, change "passages are designed as" to --passages may be configured as--

Column 3, line 1, change "another preferred refinement" to --another exemplary refinement--

Column 3, line 2, change "layers are made" to --layers may be made--

Column 3, line 3, change "material, preferably polysilicon." to --material, such as, for example, polysilicon.--

Column 3, line 4, change "another preferred refinement" to --another exemplary refinement--

Column 3, line 5, change "layers are made" to --layers maybe made--

Column 3, line 6, change "material, preferably silica," to --material, such as, for example, silica.--

Column 3, line 14, change "DRAWING" to --BRIEF DESCRIPTION OF THE DRAWINGS--

Column 3, line 16, delete "Exemplary embodiments of the present invention are illustrated in the drawing and described in detail in the description below."

UNITED STATES PATENT AND TRADEMARK OFFICE
CERTIFICATE OF CORRECTION

PATENT NO. : 7,041,225 B2
APPLICATION NO. : 10/240339
DATED : May 9, 2006
INVENTOR(S) : Markus Lutz It is certified that error appears in the above-identified patent and that said Letters Patent is hereby corrected as shown below:

Column 3, lines 20, 23, 27, 29 and 33, change "first embodiment" to --first exemplary embodiment--
    Column 3, lines 21, 24 and 28, change "stage;" to --stage.--
    Column 3, line 30, change "stage and" to --stage.--
    Column 3, line 35, change "DETAILED DESCRIPTION OF THE EXEMPLARY EMBODIMENTS" to --DETAILED DESCRIPTION--
    Column 3, lines 43 and 60, change "first embodiment" to --first exemplary embodiment--
    Column 4, line 5, change "deposited in a known manner" to --deposited in a conventional manner--
    Column 4, lines 25 and 43, change "first embodiment" to --first exemplary embodiment--
    Column 4, line 53, change "steps are carried out to" to --steps may be performed to--
    Column 5, line 5, change "basis of a preferred exemplary" to --basis of an exemplary--
    Column 5, line 12, change "may be designed to" to --may be configured to--
    Column 5, line 22, delete "it is also possible to provide"
    Column 5, line 23, change "conductor under" to --conductor may be provided under--
    Column 5, line 26, delete "it is also possible to apply"
    Column 5, line 27, change "suitable metals with dielectric lying" to --suitable metals may be applied with dielectric materials lying--
    Column 5, line 29, delete "It is possible to planarize"
    Column 5, line 29, change "the individual levels using" to --The individual levels may be pluralized using--
    Column 5, line 31, change "step, preferably only" to --step, in particular, for example only--

Signed and Sealed this

Seventeenth Day of July, 2007

JON W. DUDAS
*Director of the United States Patent and Trademark Office*